United States Patent
Kim

(10) Patent No.: US 7,919,344 B2
(45) Date of Patent: Apr. 5, 2011

(54) IMAGE SENSOR AND METHOD FOR MANUFACTURING THE SAME

(75) Inventor: Tae Gyu Kim, Masan-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 259 days.

(21) Appl. No.: 12/250,603

(22) Filed: Oct. 14, 2008

(65) Prior Publication Data

US 2009/0115014 A1    May 7, 2009

(30) Foreign Application Priority Data

Nov. 5, 2007 (KR) .......... 10-2007-0112164

(51) Int. Cl.
- H01L 21/00 (2006.01)
- H01L 31/00 (2006.01)
- H01L 31/107 (2006.01)
- H01L 31/105 (2006.01)
- H01L 27/146 (2006.01)

(52) U.S. Cl. ... 438/48; 257/458; 257/449; 257/E31.062; 257/E27.133

(58) Field of Classification Search .......... 438/48; 257/458, 449, E31.062, E27.133
See application file for complete search history.

(56) References Cited

U.S. PATENT DOCUMENTS

| | | | |
|---|---|---|---|
| 6,229,191 B1 * | 5/2001 | Cao et al. ............ | 257/444 |
| 6,396,118 B1 * | 5/2002 | Theil et al. ........... | 257/444 |
| 6,586,812 B1 | 7/2003 | Cao et al. | |
| 6,759,262 B2 * | 7/2004 | Theil et al. ........... | 438/48 |

* cited by examiner

*Primary Examiner* — Luan C Thai
(74) *Attorney, Agent, or Firm* — Saliwanchik, Lloyd & Eisenschenk

(57) ABSTRACT

Provided is an image sensor and a method for manufacturing the same. The image sensor includes a substrate on which a circuitry including a first lower metal line and a second lower metal line is formed. A lower electrode is formed on the first lower metal line. A separation metal pattern surrounds the lower electrode and connected to the second lower metal line. An intrinsic layer is formed on the lower electrode. A second conductive type conduction layer is formed on the intrinsic layer. An upper electrode is formed on the second conductive type conductive layer. A bias can be applied to the second lower metal line such that the separation metal pattern can provide a Schottky Barrier, directing electrons to the lower electrode and inhibiting crosstalk between pixels.

9 Claims, 3 Drawing Sheets

ID-REFERENCE TO RELATED
APPLICATION

The present application claims the benefit under 35 U.S.C. §119 of Korean Patent Application No. 10-2007-0112164, filed Nov. 5, 2007, which is hereby incorporated by reference in its entirety.

BACKGROUND

In general, a CMOS image sensor includes a photodiode region for converting a light signal to an electrical signal, and a transistor region for processing the converted electrical signal.

Typically, the photodiode and the transistor are arranged horizontally on a substrate. This arrangement may be referred to as a horizontal type CMOS image sensor.

That is, in a horizontal type CMOS image sensor according to the related art, a photodiode and a transistor are formed adjacent to each other for each unit pixel on a substrate. Therefore, an additional region in the pixel area of each unit pixel is required for the photodiode. This decreases a fill factor region and can limit the possibility of resolution.

Also, according to the related art, the image quality of the image sensor may become deteriorated due to a crosstalk between pixels of the photodiode array.

Additionally, in the horizontal type CMOS image sensor according to the related art, it is very difficult to achieve the optimized process of concurrently forming the photodiode and the transistor.

BRIEF SUMMARY

Embodiments of the present invention provide an image sensor and a method for manufacturing the same that can provide a new integration of a transistor circuitry and a photodiode.

According to embodiments, an image sensor and a method for manufacturing the same are provided that can inhibit crosstalk between photodiode pixels.

In one embodiment, an image sensor can comprise: a first lower metal line and a second lower metal line connected to circuitry on a substrate; a lower electrode on the first lower metal line; a separation metal pattern surrounding the lower electrode and connected to the second lower metal line; an intrinsic layer on the lower electrode; a second conductive type conduction layer on the intrinsic layer; and an upper electrode on the second conductive type conduction layer.

In another embodiment, a method for manufacturing an image sensor can comprise: forming circuitry including a first lower metal line and a second lower metal line on a substrate; forming a lower electrode on the first lower metal line; forming a separation metal pattern surrounding the lower electrode and connected to the second lower metal line; forming an intrinsic layer on the lower electrode; forming a second conductive conduction layer on the intrinsic layer; and forming an upper electrode on the second conductive type conduction layer.

The details of one or more embodiments are set forth in the accompanying drawings and the description below. Other features will be apparent from the description and drawings, and from the claims.

DETAILED DESCRIPTION

Embodiments of an image sensor and a method for manufacturing the same will be described in detail with reference to the accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, or one or more intervening layers may also be present. In addition, it will also be understood that when a layer is referred to as being 'between' two layers, it can be the only layer between the two layers, or one or more intervening layers may also be present.

Figure 1:
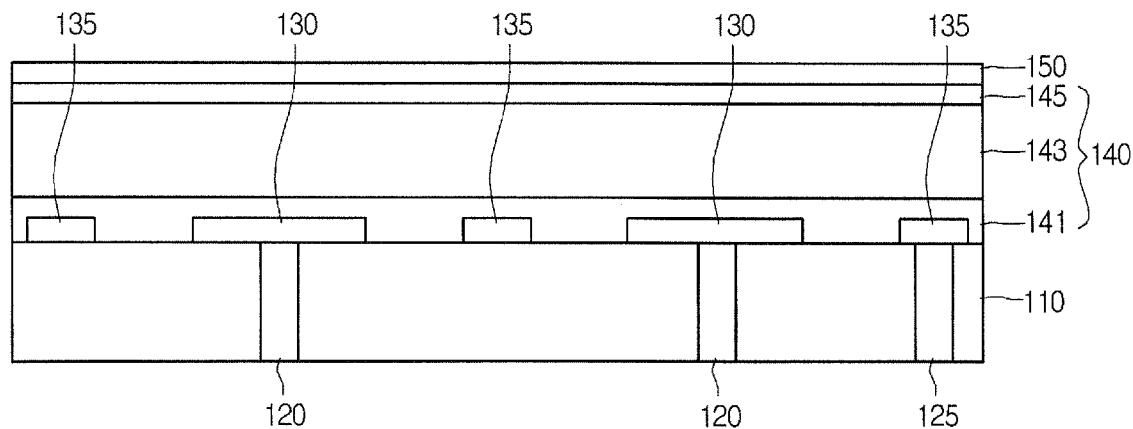
FIG. 1 is a cross-sectional view of an image sensor according to an embodiment.

Referring to FIG. 1, an image sensor according to an embodiment can include: a substrate (not shown) on which circuitry including a first lower metal line 120 and a second lower metal line 125 is formed; a lower electrode 130 on the first lower metal line 120; a separation metal pattern 135 surrounding the lower electrode 130 and connected to the second lower metal line 125; an intrinsic layer 143 on the lower electrode 130; a second conductive type conduction layer 145 on the intrinsic layer 143; and an upper electrode 150 on the second conductive type conduction layer 145.

In a further embodiment, the image sensor can include a first conductive type conduction layer 141 on the lower electrode 130, providing a PIN diode structure.

The conduction layers(s) (141 and 145) and the intrinsic layer (143) can be formed using an amorphous silicon layer.

According to an embodiment, since each pixel array is isolated by using a metal (the separation metal pattern 135), crosstalk between pixels can be inhibited from occurring.

The separation metal pattern 135 can be formed along a boundary between pixels. For example, the separation metal pattern 135 can be formed in a state connected along the boundary between pixels. In addition, the separation metal pattern 135 can be formed so as to be electrically connected with the second lower metal line 125.

At this time, the second lower metal line 125 can be provided under a portion of the bottom surface of the separation metal pattern 135. For example, the second metal line 125 can be formed at an edge of a pixel.

Figure 2:
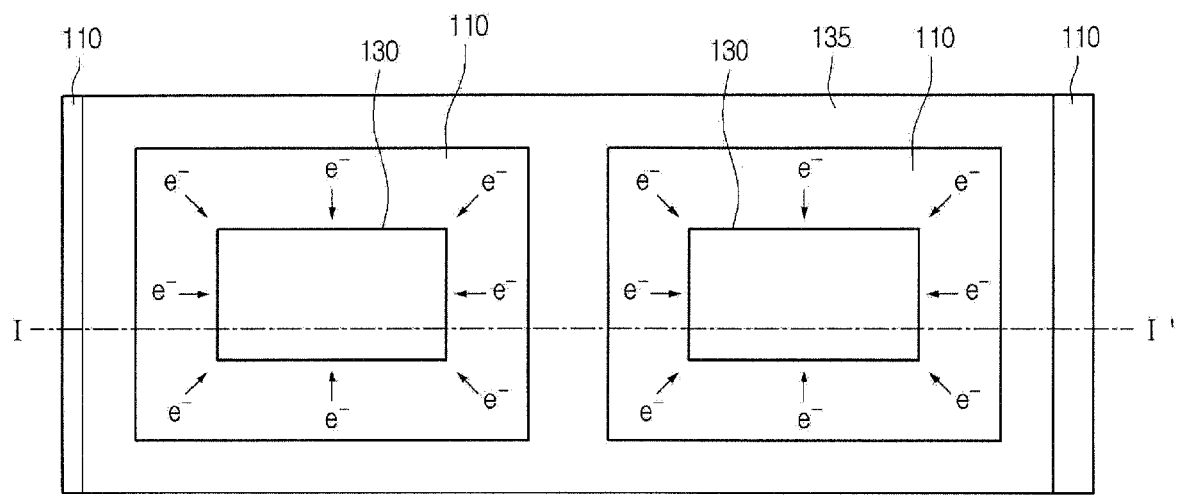
FIG. 2 is a plan view illustrating an effect of an image sensor according to an embodiment.

According to an embodiment, a reverse bias can be applied to the second lower metal line 125 and a forward bias can be applied to the first lower metal line 120. As shown in FIG. 2, by applying a potential to the first and second lower metal lines 120 and 125, electrons ($e^-$) generated in the photodiode 140 move toward the lower electrode 130 of a corresponding pixel by a repulsive force of the second lower metal line 125 and an attractive force of the first lower metal line 120. By surrounding the lower electrode 130 with the separation metal pattern 135 and applying a bias to the first and second lower metal lines 120 and 125, crosstalk between pixels can be inhibited.

That is, when a bias is applied to the first lower metal line 120 and the second lower metal line 125 (resulting in a potential between the lower electrode 130 and the separation metal pattern 135), electrons can be moved by the Schottky Barrier formed from the metal-amorphous semiconductor interface under only the forward bias as shown in FIG. 2. Electrons do not move through the second lower metal line 125 to which a reverse bias is applied. In addition, since movement of electrons generated in each pixel is limited around the second lower metal line 125 to which a reverse bias is applied by a potential barrier, the electrons move to the first lower electrode 130, which is the nearest pad in the forward direction (direction of electron flow), thereby making it possible to perform pixel isolation.

Furthermore, since the movement of electrons between pixels, which generates crosstalk, is mostly generated through the first conductive type conduction layer 141, the aforementioned structure makes it possible to perform sufficient pixel isolation. Accordingly, additional isolation structures within the intrinsic layer 143 and/or the second conductive type conduction layer 143 can be omitted. Therefore, additional etching steps for forming such structures are omitted.

A method for manufacturing an image sensor according to an embodiment will be described with respect to FIGS. 3 to 5.

Figure 3:
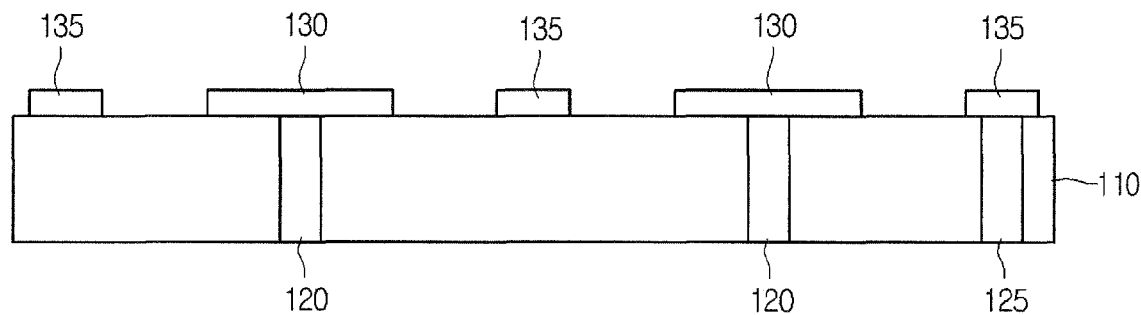
FIGS. 3 to 5 are cross-sectional views illustrating a method for manufacturing an image sensor according to an embodiment.
Figure 4:
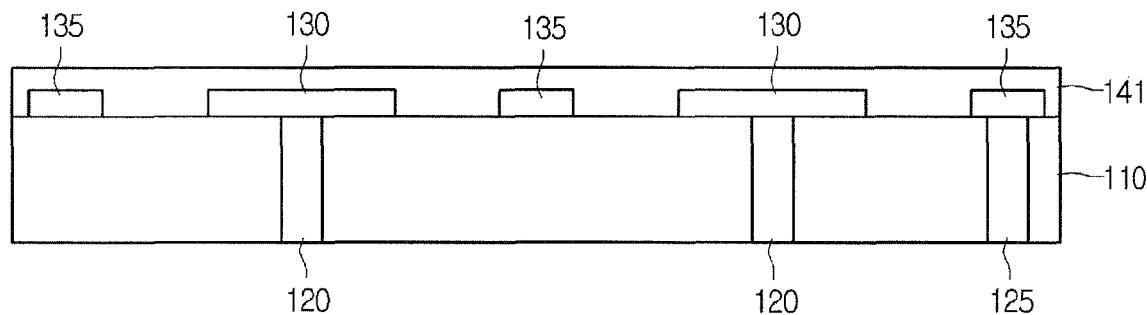
Figure 5:
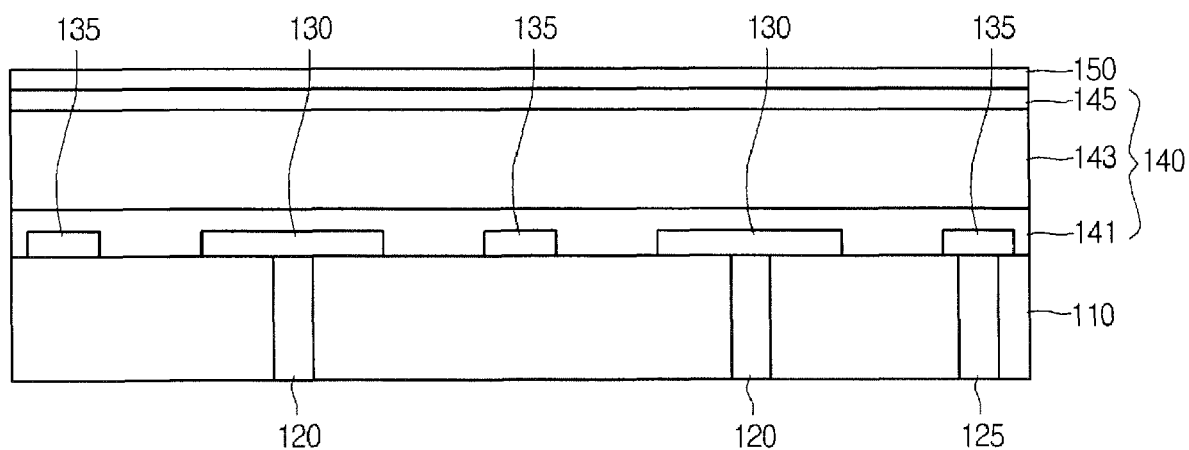

FIGS. 3 to 5 are cross-sectional views taken along line I-I' of FIG. 2.

Referring to FIG. 3, circuitry (not shown) can be formed on a substrate (not shown). A first lower metal line 120 and a second lower metal line 125 can be formed on the substrate and connected to the circuitry.

An interlayer insulating layer 110 can be formed on the substrate. The first lower metal line 120 and the second lower metal line 125 can be formed by selectively etching the interlayer insulating layer 110 to form a trench and filling the trench with a metal layer.

At this time, the first lower metal line 120 can be formed for each pixel, but the second lower metal line 125 does not need to be formed for every pixel. That is, the second lower metal line 125 can be formed one or more for each device unit. For example, one second lower metal line 125 can be used to provide a power (or ground) signal to the subsequently formed separation metal pattern 135 along boundaries of a plurality of pixels. This is particularly available for the case where the separation metal pattern 135 is connected for adjacent pixels (see e.g., FIG. 2).

Next, a lower electrode 130 and the separation metal pattern 135 can be formed. For example, the lower electrode 130 can be formed on the first lower metal line 120 and the separation metal pattern 135 can be formed to surround the lower electrode 130.

The lower electrode 130 and the separation metal pattern 135 can be formed concurrently or sequentially.

The lower electrode 130 and the separation metal pattern 135 can be formed of the same conductive material or different conductive materials.

For example, when the lower electrode 130 and the separation metal pattern 135 are formed of the same conductive material, the lower electrode 130 and the separation metal pattern 135 can be formed concurrently. According to an embodiment, the lower electrode 130 and the separation metal pattern 135 can be formed concurrently by forming a conductive metal layer on an entire surface of the substrate including the first lower metal line 120 and the second lower metal line 125 and selectively etching the conductive metal layer using a photoresist pattern as an etch mask.

The lower electrode 130 and the separation metal pattern 135 can be formed of any suitable metals known in the art, such as, for example, aluminum (Al), copper (Cu), or cobalt (Co).

The separation metal pattern 135 can be formed along a boundary between pixels. For example, the separation metal pattern 135 can be formed in a state connected along the boundary between pixels.

At this time, the second lower metal line 125 can be provided formed under a portion of a bottom surface of the separation metal pattern 135. For example, the second metal line 125 can be formed at an edge of a pixel.

Next, referring to FIG. 4, a first conductive type conduction layer 141 can be formed on the lower electrode 130. In certain embodiments, the first conductive type conduction layer 141 can be omitted. In an embodiment, the first conductive type conduction layer 141 can act as an N-layer of a PIN diode employed in the embodiment. That is, the first conductive type conduction layer 141 can be an N-type conduction layer, but embodiments are not limited thereto.

In one embodiment, the first conductive type conduction layer 141 can be formed of n-doped amorphous silicon. For example, the first conductive type conduction layer 141 can be formed of a-Si:H, a-SiGe:H, a-SiC, a-SiN:H, or a-SiO:H, which are formed by adding Ge, C, N, O to amorphous silicon. The first conductive type conduction layer 141 can be formed by a chemical vapor deposition (CVD) process such as plasma enhanced CVD (PECVD). According to an embodiment, the first conductive type conduction layer 141 can be formed by a PECVD in which $PH_3$ or $P_2H_5$ are mixed with Silane ($SiH_4$) gas.

Next, referring to FIG. 5, an intrinsic layer 143 can be formed on the first conductive type conduction layer 141 (or on the lower electrode 130 when the first conductive type conduction layer 141 is omitted). The intrinsic layer 143 can act as an I-layer of the PIN diode employed in the embodiment.

In one embodiment, intrinsic layer 143 can be formed of amorphous silicon. The intrinsic layer 143 can be formed by a CVD process such as PECVD. For example, the intrinsic layer 143 can be formed by PECVD using silane ($SiH_4$) gas.

Thereafter, a second conductive type conduction layer 145 can be formed on the intrinsic layer 143. The second conductive type conduction layer 145 and the intrinsic layer 143 may be formed in-situ. In an embodiment, the second conductive type conduction layer 145 can act as a P-layer of the PIN diode employed in the embodiment. That is, the second conductive type conduction layer 145 can be a P-type conduction layer, but embodiments are not limited thereto.

In one embodiment, the second conductive type conduction layer 145 can be formed of p-doped amorphous silicon. The second conductive type conduction layer 145 can be formed by a CVD process such as PECVD. For example, the second conductive type conduction layer 145 can be formed by PECVD in which Boron (B) is mixed with Silane ($SiH_4$) gas.

Next, an upper electrode 150 can be formed on the second conductive type conduction layer 145. The upper electrode 150 can be formed of a transparent electrode material having a high light transmission and a high conductivity. For example, the upper electrode 150 can be formed of indium tin oxide (ITO) or cadmium tin oxide (CTO).

In a further embodiment, a color filter layer (not shown) can be formed on the upper electrode 150.

The image sensor and the method for manufacturing the image sensor according to embodiments of the present invention can provide a vertical integration of the transistor circuitry and the photodiode.

In addition, according to embodiments, because pixels in a pixel array of an image sensor using amorphous silicon-based photodiodes are isolated by using a metal, crosstalk between pixels can be inhibited.

Further, according to embodiments, since an additional etch or a CMP process is not performed after an amorphous silicon layer is deposited, generation of a defect in the photodiode can be minimized, thereby enhancing the dark characteristic.

Furthermore, according to an embodiment, the vertical integration of the transistor circuitry and the photodiode makes it possible to obtain a fill factor close to 100%.

In addition, according to embodiments, the vertical integration of the transistor circuitry and the photodiode makes it possible to provide a sensitivity higher than that in the related art.

Moreover, manufacturing cost for obtaining a selected resolution can be reduced compared with that in the related art.

Also, according to embodiments, by providing vertical integration, each unit pixel can implement more complicated circuitry without decreasing the sensitivity.

Further, an additional on-chip circuitry that can be integrated by the embodiments can increase the performance, achieve the device miniaturization and save manufacturing costs.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An image sensor comprising:
   a first lower metal line and a second lower metal line on a substrate comprising circuitry;
   a lower electrode on the first lower metal line;
   a separation metal pattern around the perimeter of the lower electrode;
   an intrinsic layer on the lower electrode, wherein a bottom surface of the intrinsic layer is above the separation metal pattern;
   a second conductive type conduction layer on the intrinsic layer; and
   an upper electrode on the second conductive type conduction layer,
   wherein the separation metal pattern is disposed along a boundary between pixels,
   wherein the separation metal pattern is provided in a state connected along the boundary between the pixels,
   wherein the second lower metal line is connected to a portion of a bottom surface of the separation metal pattern,
   wherein the separation metal pattern is connected so as to provide a Schottky Barrier by an application of a bias through the second lower metal line.

2. The image sensor according to claim 1, further comprising a first conductive type conduction layer on the lower electrode.

3. The image sensor according to claim 1, wherein the separation metal pattern is electrically connected with the second lower metal line.

4. The image sensor according to claim 1, wherein the lower electrode and the separation metal pattern comprise the same material.

5. A method for manufacturing an image sensor, comprising:
   forming a circuitry including a first lower metal line and a second lower metal line on a substrate;
   forming a lower electrode on the first lower metal line;
   forming a separation metal pattern surrounding the lower electrode, wherein a bottom surface of the intrinsic layer is above the separation metal pattern;
   forming an intrinsic layer on the lower electrode;
   forming a second conductive conduction layer on the intrinsic layer; and
   forming an upper electrode on the second conductive type conduction layer,
   wherein the separation metal pattern is disposed along a boundary between pixels,
   wherein the separation metal pattern is provided in a state connected along the boundary between the pixels,
   wherein the second lower metal line is connected to a portion of a bottom surface of the separation metal pattern,
   wherein the separation metal pattern is connected so as to provide a Schottky Barrier by an application of a bias through the second lower metal line.

6. The method according to claim 5, further comprising forming a first conductive type conduction layer on the lower electrode before forming the intrinsic layer.

7. The method according to claim 5, wherein in the forming of the separation metal pattern, the separation metal pattern is formed so as to be electrically connected with the second lower metal line.

8. The method according to claim 5, wherein the lower electrode and the separation metal pattern are formed concurrently and of the same conductive material.

9. The method according to claim 5, wherein the lower electrode and the separation metal pattern are sequentially formed.

* * * * *